United States Patent
Fetzer et al.

(10) Patent No.: US 10,069,026 B2
(45) Date of Patent: Sep. 4, 2018

(54) REDUCED BAND GAP ABSORBER FOR SOLAR CELLS

(75) Inventors: Christopher M. Fetzer, Saugus, CA (US); Dmitri D. Krut, Encino, CA (US); David E. Joslin, Valley Village, CA (US); Sara R. Joslin, legal representative, Valley Village, CA (US); Richard R. King, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 1299 days.

(21) Appl. No.: 11/305,967

(22) Filed: Dec. 19, 2005

(65) Prior Publication Data

US 2007/0137695 A1 Jun. 21, 2007

(51) Int. Cl.
| | |
|---|---|
| *H01L 31/00* | (2006.01) |
| *H01L 31/0725* | (2012.01) |
| *H01L 31/0352* | (2006.01) |
| *H01L 31/0735* | (2012.01) |
| *H01L 31/075* | (2012.01) |
| *H01L 31/078* | (2012.01) |
| *B82Y 20/00* | (2011.01) |

(52) U.S. Cl.
CPC .......... *H01L 31/0725* (2013.01); *B82Y 20/00* (2013.01); *H01L 31/035236* (2013.01); *H01L 31/075* (2013.01); *H01L 31/078* (2013.01); *H01L 31/0735* (2013.01); *Y02E 10/544* (2013.01); *Y02E 10/548* (2013.01)

(58) Field of Classification Search
CPC combination set(s) only.
See application file for complete search history.

(56) References Cited

U.S. PATENT DOCUMENTS

| | | | |
|---|---|---|---|
| 4,688,068 A | | 8/1987 | Chaffin et al. |
| 4,756,074 A | * | 7/1988 | Lewis ................. H01L 31/0687 117/104 |
| 5,021,099 A | | 6/1991 | Kim et al. |
| 5,407,491 A | * | 4/1995 | Freundlich et al. .......... 136/249 |
| 5,496,415 A | * | 3/1996 | Barnham ............... B82Y 20/00 136/255 |

(Continued)

OTHER PUBLICATIONS

"Quantum Confinement", accessed from http://phycomp.technion.ac.il/~anastasy/thesis/node10.html on Jul. 25, 2012.*

(Continued)

*Primary Examiner* — Golam Mowla
(74) *Attorney, Agent, or Firm* — Gates & Cooper LLP (57) ABSTRACT

Methods and apparatuses for a dual heterojunction multi-junction solar cell are disclosed. A method in accordance with the present invention comprises growing a base material for a solar cell, growing at least one dual heterojunction on the base material, and growing an emitter on the at least one dual heterojunction. An apparatus in accordance with the present invention comprises a substrate, and a first subcell, coupled to the substrate, wherein the first subcell comprises a base region, coupled to the substrate, an emitter region, and at least one dual heterojunction, coupled between the base region and the emitter region, wherein the at least one dual heterojunction has a lower bandgap than the emitter region.

14 Claims, 8 Drawing Sheets

(56) References Cited

U.S. PATENT DOCUMENTS

| | | | |
|---|---|---|---|
| 5,800,630 A * | 9/1998 | Vilela | H01L 31/03042 136/249 |
| 5,851,310 A * | 12/1998 | Freundlich et al. | 136/255 |
| 5,853,497 A | 12/1998 | Lillington et al. | |
| 5,935,345 A * | 8/1999 | Kuznicki | H01L 31/068 136/255 |
| 6,147,296 A * | 11/2000 | Freundlich | 136/255 |
| 6,150,603 A | 11/2000 | Karam et al. | |
| 6,150,604 A * | 11/2000 | Freundlich et al. | 136/253 |
| 6,255,580 B1 | 7/2001 | Karam et al. | |
| 6,316,715 B1 | 11/2001 | King et al. | |
| 6,340,788 B1 | 1/2002 | King et al. | |
| 6,372,980 B1 * | 4/2002 | Freundlich | B82Y 20/00 136/255 |
| 6,380,601 B1 | 4/2002 | Ermer et al. | |
| 6,586,669 B2 | 7/2003 | King et al. | |
| 2002/0117675 A1 * | 8/2002 | Mascarenhas | H01L 29/167 257/87 |
| 2002/0195137 A1 * | 12/2002 | King | H01L 31/0725 136/249 |
| 2003/0070707 A1 * | 4/2003 | King et al. | 136/255 |
| 2003/0089392 A1 * | 5/2003 | Rohr | B82Y 20/00 136/255 |
| 2003/0145884 A1 * | 8/2003 | King | H01L 31/02168 136/255 |
| 2004/0065363 A1 * | 4/2004 | Fetzer | H01L 21/02381 136/262 |
| 2005/0247339 A1 | 11/2005 | Barnham et al. | |

OTHER PUBLICATIONS

Extended European Search Report dated Apr. 2, 2014 for European Patent Application No. 06077166.4.

Corkish, R., et al., "Dark Currents in Double-Heterostructure and Quantum-Well Solar Cells", Conference Record of the 26th IEEE Photovoltaic Speciallits Conference—1997. PVSC '97, Anaheim, CA, Sep. 29-Oct. 3, 1997; IEEE Photovoltaic Specialists Conference, New York, NY: IEEE, US, Sep. 29, 1997, pp. 923-926, XP010268026.

Ramey, S.M., et al., "Modeling of Multiple-Quantum-Well Solar Cells Including Capture, Escape, and Recombination of Phtoexcited Carriers in Quantum Wells", IEEE Transactions on Electron Devices, May 2003, pp. 1179-1188, vol. 50, No. 5, XP055109977.

Kim N. P. et al: "High efficiency GaAs/CuInSe2 tandem junction solar cells", Sep. 26, 1988 (Sep. 26, 1988), pp. 457-461.

Lade S J et al: "A revised ideal model for AIGaAs/GaAs quantum well solar cells", Microelectronics Journal, vol. 35, No. 5, May 1, 2004 (May 1, 2004), pp. 401-410.

EPO Communication dated Jan. 18, 2018 for European application No. 06077166.4.

European Examination Report dated Jul. 23, 2018 for European Patent Application No. 06077166.4.

Jackrel, David, et al. "MBE grown GaInNAs solar cells for multijunction applications", Conference Record of the IEEE Photovoltaic Specialists Conference, Feb. 2005, pp. 854-857.

Kim, C-Y., et al., "Improvement of short-circuit current of InP/InGaAsP/InP double heterojunction solar cells", Electronics Letters, Apr. 28, 2005, pp. 1-2, vol. 41, No. 9.

* cited by examiner

Prior Art

REDUCED BAND GAP ABSORBER FOR SOLAR CELLS

This invention was first conceived and demonstrated with Government support under Contract No. F29601-98-2-0207 awarded by the United States Air Force. The Government has certain rights in this invention.

BACKGROUND OF THE INVENTION

1. Field of the Invention

The present invention relates generally to solar cells, and, in particular, to a method, apparatus, and article of manufacture of a reduced band gap absorber for solar cells.

2. Description of the Related Art

Solar energy created through the photovoltaic effect is the main source of power for most commercial and government spacecraft. The amount of power generated by an array of solar cells is limited by the launch volume and launch weight. These restrictions limit the capability of the spacecraft. Similarly, any terrestrial solar cells are limited by the size of an array that can be installed in a given installation.

To be able to increase payload capability, or power delivery capability, the power per unit area for the solar cell array must be increased. Increasing the efficiency of the solar cell is of primary importance for enabling near-earth missions. The dominant solar cell technology for this application is a combination of subcells comprising Gallium Indium Phosphide (GaInP), Gallium Arsenide (GaAs), and Germanium (Ge), which is typically called a triple-junction, or "3J", device.

The current best efficiency of a 3J device at the Beginning Of Life (BOL) is 28.6%, which degrades over time to an End Of Life (EOL) final percentage. Solar cells used in space must survive for up to fifteen years in an environment rich in atomic oxygen and energetic sub-atomic particles, which degrades the solar cells significantly. The general objective of any change in the design of solar cells is to reduce the cost of the device, the BOL efficiency, or to decrease the rate of degradation such that the EOL efficiency is higher as well.

Several approaches have been used to try to make solar cells more efficient or less costly. One approach is to use a multiple quantum-well (MQW) approach, which makes the efficiency go up but also makes the cells much more expensive because of the tolerances required to make an MQW structure. Other approaches use layer thickening, additional subcell structures, or mismatch of the subcell materials, each of which adds to the cost as well as the weight of the cell, limiting the usefulness of such approaches.

It can be seen, then, that there is a need in the art for more efficient solar cells.

SUMMARY OF THE INVENTION

To minimize the limitations in the prior art, and to minimize other limitations that will become apparent upon reading and understanding the present specification, the present invention provides methods and apparatuses for a dual heterojunction multijunction solar cell. A method in accordance with the present invention comprises growing a base material for a solar cell, growing at least one dual heterojunction on the base material, and growing an emitter on the at least one dual heterojunction.

Such a method further optionally includes the base, emitter, and at least one dual heterojunction being in a top cell of a triple-junction solar cell, the at least one dual heterojunction being at least 200 angstroms in thickness, the at least one dual heterojunction being a stack of alternating low bandgap materials and barrier materials, the at least one dual heterojunction being contained within a depletion region created by the base material and the emitter, and a material for the low bandgap material being gallium arsenide.

An apparatus in accordance with the present invention comprises a substrate, and a first subcell, coupled to the substrate, wherein the first subcell comprises a base region, coupled to the substrate, an emitter region, and at least one dual heterojunction, coupled between the base region and the emitter region, wherein the at least one dual heterojunction has a lower bandgap than the emitter region.

Such an apparatus further optionally includes a second subcell, coupled between the substrate and the first subcell, the at least one dual heterojunction being at least 200 angstroms in thickness, the at least one dual heterojunction being a stack of alternating low bandgap material and barrier materials, the at least one dual heterojunction being contained within a depletion region created by the emitter region and the base region, and a material for the dual heterojunction being one or any alloy combination (continuous or digital) of: GaAs, GaInAs, GaInAsN, GaInAsNSb, GaInP, GAPN, GaInPN, InPN, InN, InNAs, GaInPAsN, InP, AlGaInP, GaAsP, AlGaAs, GaInAsP, GaSb, InSb, InAs, Ge, SiGe, SiGeC, SiGeSn, ZnGeAs, ZnGeSiAs, CuAlGaInS, CuAlGaInSe, as long as the alloy is of lower band gap than the host surrounding barrier layers and/or base/emitter material(s).

An alternate embodiment of the present invention comprises a dual heterojunction region of at least 200 angstroms thickness, the dual heterojunction region being contained within a depletion region of the solar cell, such that the dual heterojunction region generates additional current in the solar cell by absorbing incident light within the dual heterojunction region.

Such an embodiment optionally further includes the dual heterojunction region being in a top subcell of a multijunction solar cell.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The current 3J concept of GaInP/Ga(In)As/Ge is not optimal. This occurs because the layers are grown one on top of another epitaxially, and, to perform such growth, the lattice spacing of the materials must be very similar. The lattice constants for the material restricts the choices of materials available for cell combinations. Since the cells are electrically connected in series, the cell producing the lowest current will limit the current produced by the entire cell stack. As such, the current produced by each of the subcells should be approximately the same, or the excess current produced generates waste heat.

The natural GaInP material in the stack produces too much current compared to the Ga(In)As subcell. Typically, the GaInP subcell is thinned to balance the current. The optimal bandgap for a balanced current from the GaInP subcell is 2.0 eV.

To balance the current in the top and middle subcells of a 3J solar cell, there must be relatively thick layers of GaInP (usually Aluminum Gallium Indium Phosphide, or AlGaInP) and GaAs (usually Gallium Indium Arsenide, or GaInAs). Costwise, the thicker the layer, the more expensive it is to produce. Further, the device will weigh more, and will be more susceptible to degradation due to larger layers having a larger radiation exposure. To create a bandgap of 2.0 eV in AlGaInP, approximately four times as much material must be used to balance the current with the middle cell. As can be seen, this increases cost, weight, and decreases EOL efficiency.

MQW approaches have thinned the upper layers somewhat, but the quantum well layers now must be extremely thin. Thinner layers absorb less light, and, as such, many quantum wells must be employed to allow enough light to be absorbed to generate enough gain from the device. Typically, between 10 and 100 wells of an average thickness of 75 to 100 angstroms each are used. The advantage of quantum well generation of current is that the quantum confinement raises the allowed states in the well above the bandgap of the material, which usually provides for lower dark currents and a higher voltage for the quantum well compared to the bulk material. However, the elevated energy of the allowed states results fewer long-wavelength photons that can be absorbed and lower current density, imposing a penalty for cell performance in the multiple quantum well approach. Moreover, the MQW approach is typically accompanied by a loss in open circuit voltage, as well as additional costs to create the large number of very thin layers.

The present invention uses a small number of lower bandgap regions in the intrinsic or depletion region of one or more of the subcells of the solar cell. The regions are sufficiently thick so as not to be quantum well in nature, and relatively shallow such that generated carriers may easily escape. The required energy profile or substructure of the low band gap absorber region is arbitrary, which allows for lower tolerances on the fabrication of devices made using the present invention.

Figure 1:
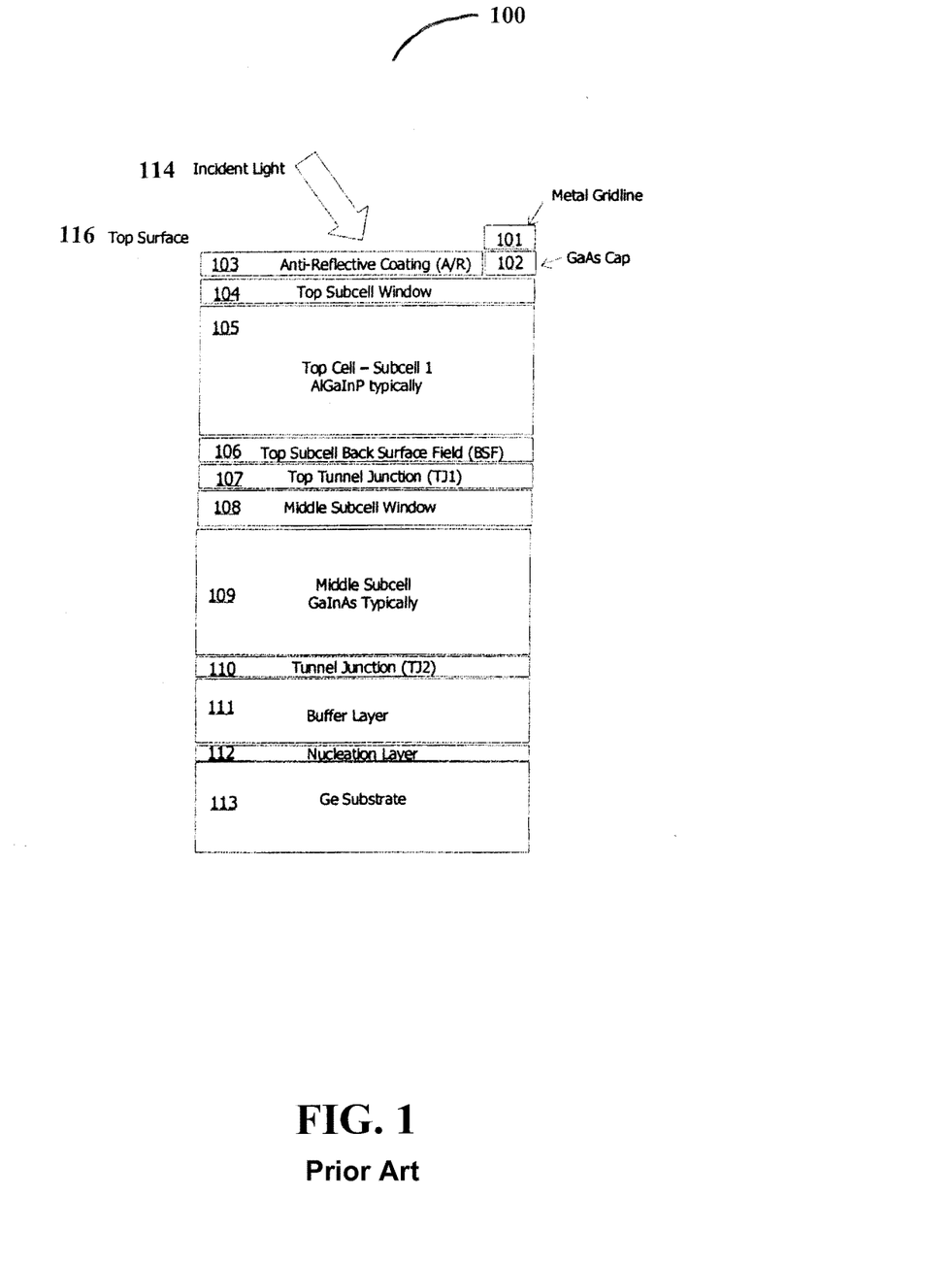
FIG. 1 illustrates a triple junction solar cell of the related art.

FIG. 1 illustrates a triple junction solar cell of the related art.

Cell 100 has regions where metal gridline 102 and a GaAs cap 102 cover the cell, and an Anti-Reflective (A/R) coating 103 covering the top subcell window 104. Top subcell 105 is typically an AlGaInP subcell, which has a Back Surface Field (BSF) 106. Top Tunnel Junction (TJ1) 107 is resident between the top cell 105 and the middle subcell window 108. Middle subcell 109 is typically GaInAs, or GaSbAs, which has a Tunnel Junction (TJ2) 110 between subcell 109 and a buffer layer 111. A nucleation layer 112 is placed between buffer layer 111 and the substrate 113, which is typically Germanium.

Incident light 114 strikes top surface 116 and is converted to electrical voltage and current in the top subcell 105, middle subcell 109, and the substrate 113. The top subcell 105, middle subcell 109, and substrate 113 each typically convert different wavelengths of light into electrical energy, and the subcells 105 and 109 and substrate 113 are chosen such that the wavelengths of light overlap to some degree to increase the efficiency of the solar cell 100.

Figure 2:
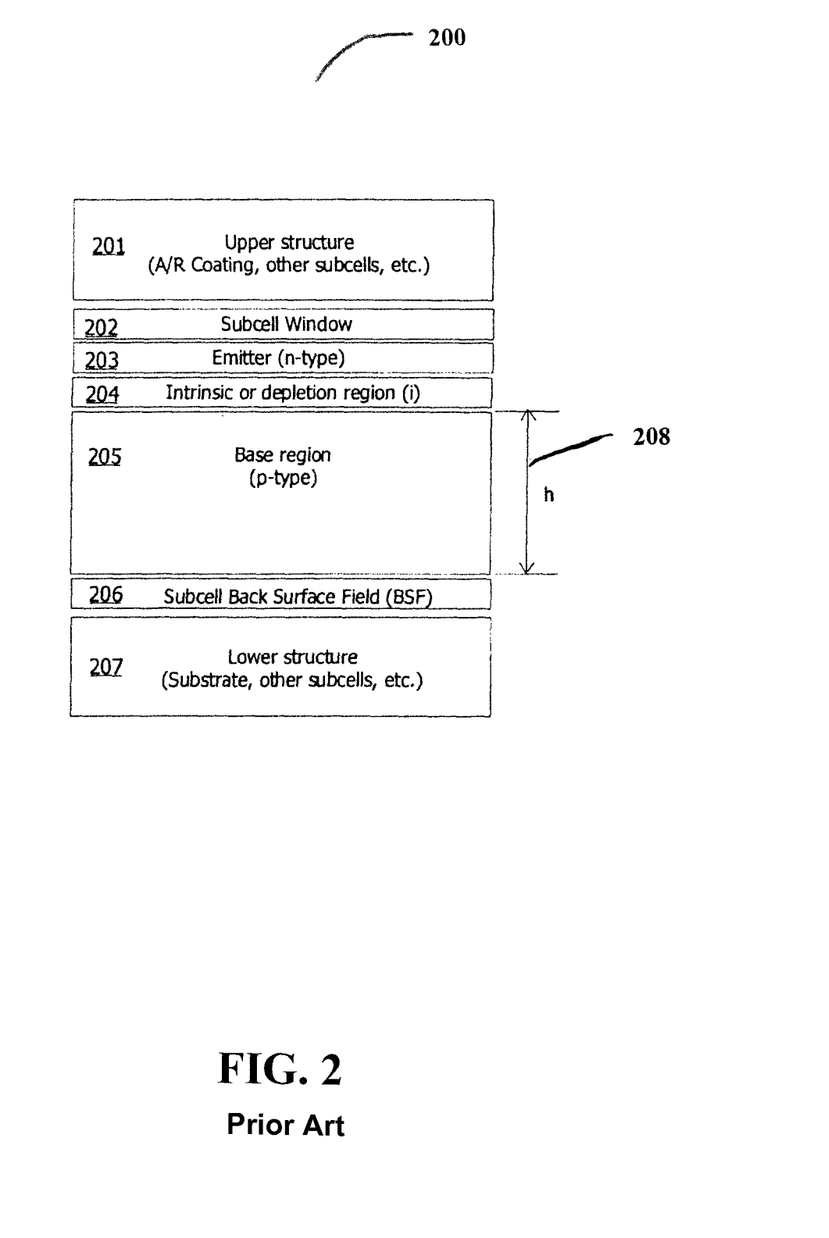
FIG. 2 illustrates a subcell in a triple junction solar cell of the related art.

FIG. 2 illustrates a subcell in a triple junction solar cell of the related art.

Subcell 200 shows an upper structure 201, a subcell window 202, an emitter 203, an intrinsic or depletion region 204, a base region 205, a BSF 206, and a lower structure 207. Although shown as an n-type on p-type subcell 200, a p-type on n-type subcell 200 can be made without departing from the scope of the present invention. FIG. 2 illustrates a typical top subcell 105, or middle subcell 109, with the adjoining subcell windows, BSF, etc. used for such subcells in a solar cell 100.

The problem with the related art is that height h 208 of base region 205 increases exponentially for top subcell 105. This effect occurs because the solar cell 100 is connected in series. The lowest current generating portion of solar cell 100, i.e., one of subcell 105, 109, and substrate 113, limits the current produced for the overall solar cell 100. The top subcell 105 is the limiting factor in terms of current generation, and, as such, the top subcell 105 must be made thicker in height 208. 2.0 eV is the optimal bandgap by theory for top subcell 105. To produce a 2.0 eV top subcell 105, it must be thicker, which takes longer to grow and thus becomes more costly. Further, these thicker cells are more easily degraded by space environments, which depend on minority carrier travel distance through the cell. The thicker the cell, the farther minority carriers must travel. A degraded lattice structure prevents minority carriers from travelling very far without scattering or recombination.

Insertion of Low Band Gap Regions

Figure 3:
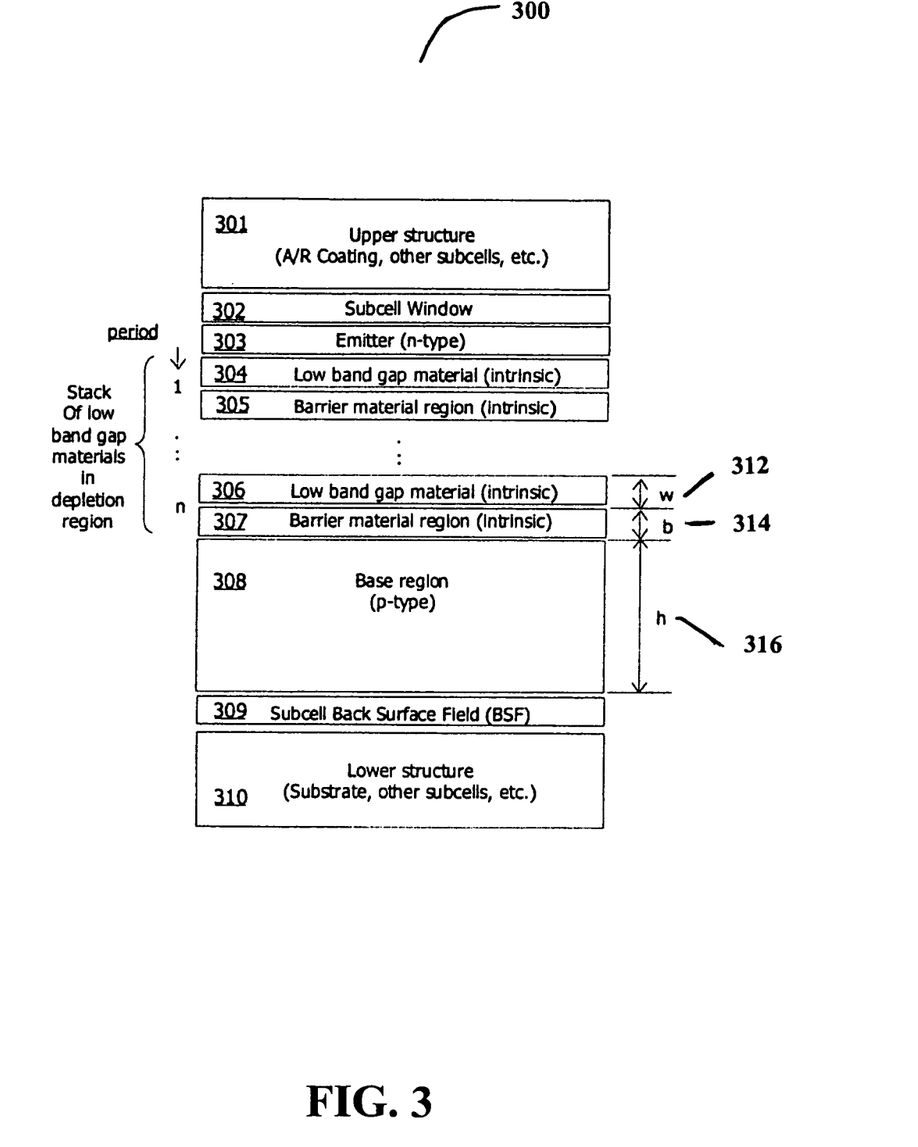
FIG. 3 illustrates a subcell in accordance of the present invention.

FIG. 3 illustrates a subcell in accordance of the present invention.

Subcell 300 is shown with an upper structure 310, subcell window 302, emitter 303, low bandgap material 304, barrier material 305, low bandgap material 306, barrier material 307, base region 308, BSF 309, and lower structure 310. Rather than a single intrinsic region 204 as shown in FIG. 2, the present invention uses a stack of low band gap materials in the depletion region between emitter 303 and base 308 to build up the 2.0 eV top subcell (or any other subcell in solar cell 300). There can be a larger or smaller number of low band gap materials 304, 306 in a periodic or non-periodic structure, having a typical thickness w 312, and a larger or smaller number of barrier material regions 305, 307 having a typical thickness b 314, resident on top of base 308 having a thickness h 316. Each pair of low bandgap material 304/barrier material 306 is typically referred to as a Dual Heterostructure (DH).

Each low band gap material 304, 306 is a well layer, where w 312 is the depth of the well. For quantum well structures, w 312 combined with b 314 is typically less than 200 angstroms. However, in the present invention, w 312 combined with b 314 is greater than 200 angstroms, and typically a few hundred angstroms, because the wells are not sufficiently thin to entrap a generated electron and change its quantum character, thus, there is no quantum confinement of generated electrons in specific energy states in layers 304 and 306. The present invention allows for the building of low band-gap regions (e.g. 304, 306) in the depletion region between emitter 303 and base 308, where these low band gap regions absorb light below the bandgap of the higher bandgap base 308 material. The current that is produced by generating electron-hole pairs as carriers, which are then swept from the depletion region (where layers 304-307 are) and collected at the higher band-gap emitter 303 and base 308 materials.

Figure 4:
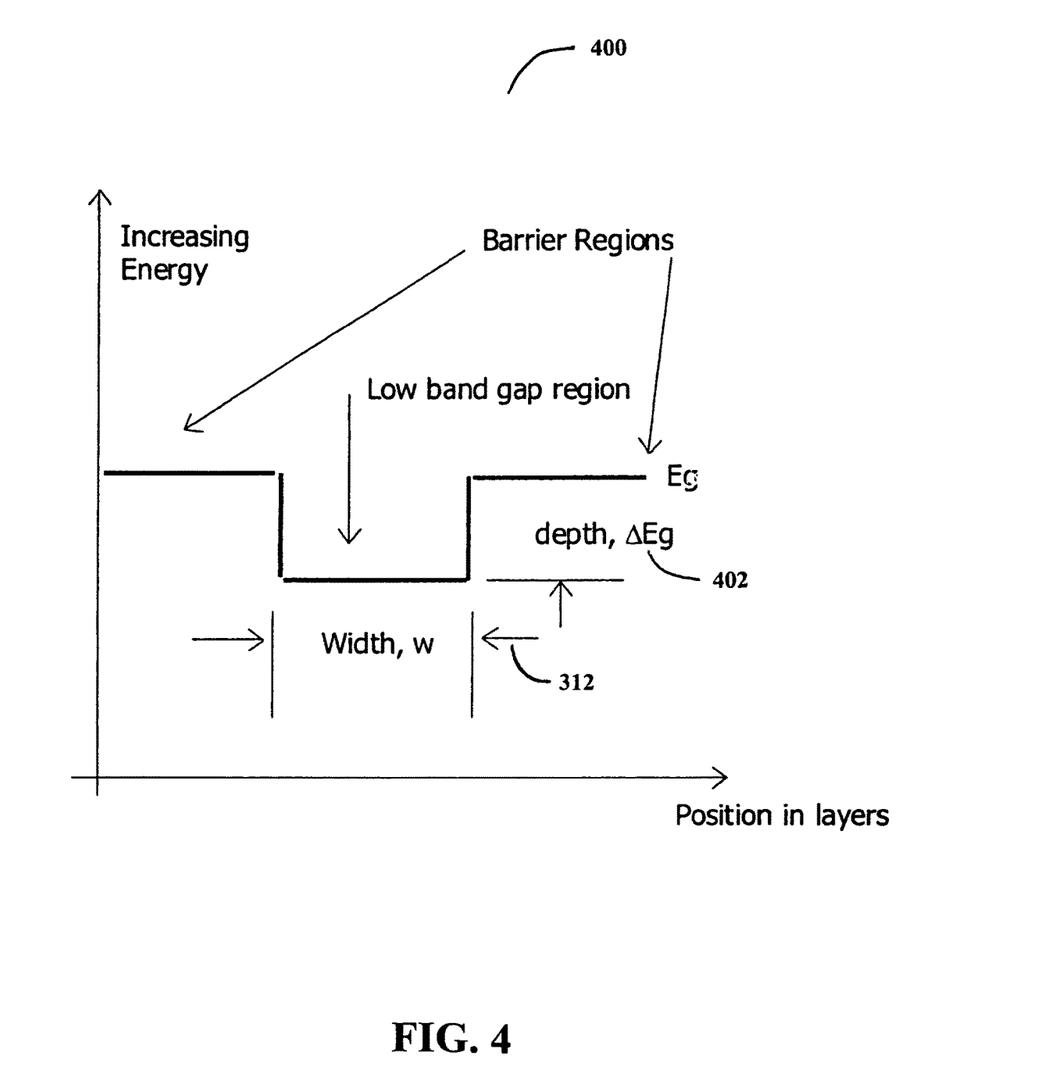
FIG. 4 illustrates a schematic of a well of lower band gap enclosed by regions of higher band gap material as used in the present invention.

FIG. 4 illustrates a schematic of a well of lower band gap enclosed by regions of higher band gap material as used in the present invention.

The width w 312 of the absorber region (low band gap regions 304 and 306) has a depth 402. This depth can represent the difference to either the conduction band or the valence band of the material to show the confinement in the absorber regions 304 and 306. For a GaAs DH in an AlGaAs material with a depth of approximately 100 meV, the thickness is about 200 angstroms. At lower thicknesses, the DH begins acting like a quantum well, with the energy level of the lower bound state in the well becoming substantially higher than be bandgap of the well material. In the DH considered here, the influence of the quantum effect on the lowest energy transition in the well becomes indistinguishable from the bandgap, such that the lower bound state is within a fraction of the available thermal energy. When the DH is too thick, the quasi-Fermi levels in the depletion region may collapse to that of the low bandgap material and there will be a voltage drop in the open circuit voltage of the device 300. Further, the low bandgap regions (304, 306 and the barrier materials 305, 307) must be fully contained within the depletion region created by emitter 303 and base region 308. The depletion region is dependent upon the dopant densities of emitter 303 and base 308; as long as the DH pairs are located within the depletion region, the electric field in the depletion region accelerates the charges out of the DH and aids in their collection in the emitter 303 and base 308. Without the electric field, the generated carriers will remain in the DH and generate only dark current, which lowers the voltage and does not contribute to the current generated by the device 300.

Experimental Results

Figure 5:
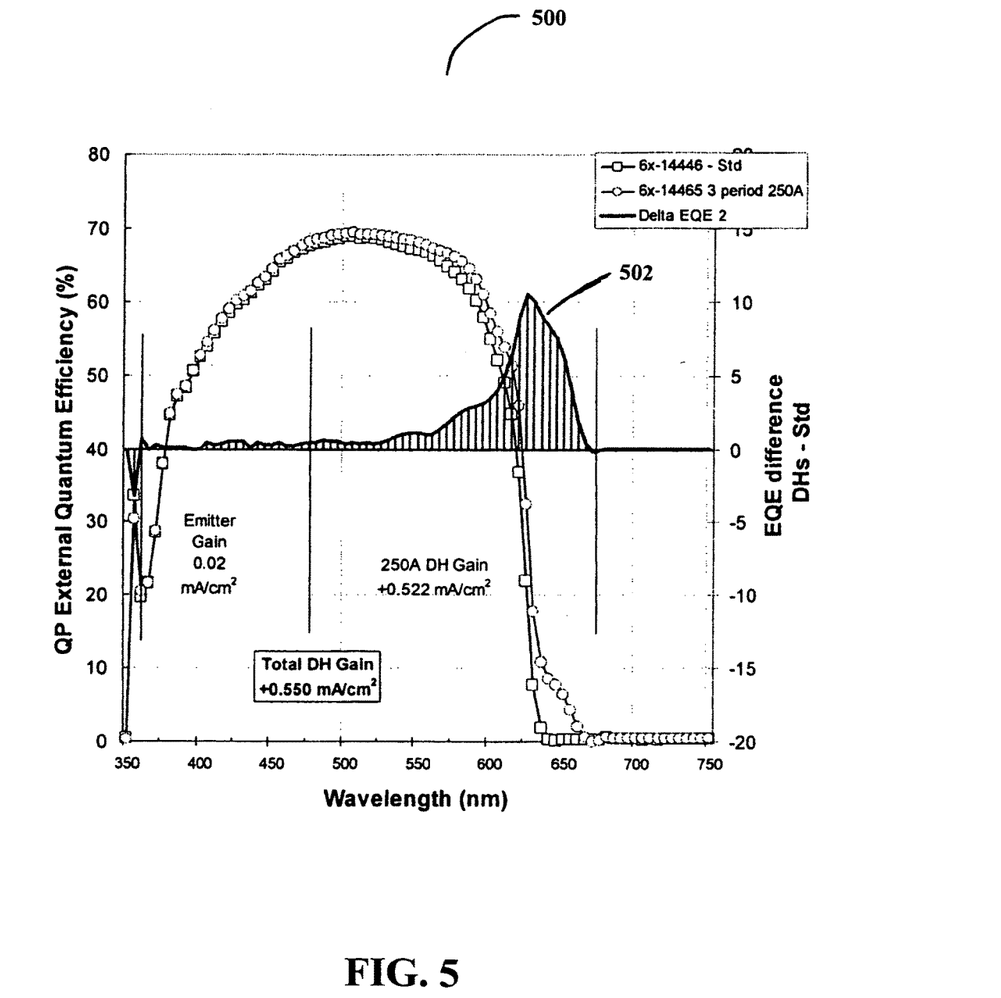
FIG. 5 illustrates an example of the spectral response of an AlGaInP top subcell with and without the dual heterostructures of the present invention.

FIG. 5 illustrates an example of the spectral response of an AlGaInP top subcell with and without the dual heterostructures of the present invention.

Chart 500 shows the quantum efficiency on the x axis versus wavelength on the y-axis, with squares representing the efficiency of a related art 3J cell, and circles representing the efficiency of a 3Jcell with the Dual Heterostructures of the present invention. The DHs used in the structure were 250 angstroms thick, and there were three periods of DHs used in this experiment. Note that the solid line 502 shows the difference in efficiency of the device with the DHs present versus the related art 3J solar cell.

The related art solar cell has an AlGaInP top subcell (shown as element 105 in FIG. 1) having a bandgap of 1.98 eV and the base thickness (shown as base 205 in FIG. 2) having a thickness 208 of 7000 angstroms. Note that there is not a change in absorption coefficient in changing to a quantum state with an inflection or step function density of states, and, as such, the DHs are not acting as quantum wells. There is a net gain of 0.550 mA/cm2 for the addition of the absorber region. This net gain came at the addition of approximately 1000 angstroms of thickness. To achieve a similar gain by traditional methods, eight quantum wells of 90 angstroms each could be added, or the base layer 205 could be thickened by about 5000 to 7000 angstroms of thickness. Therefore, the present invention saves a net of approximately 4000 to 6000 angstroms of material. Since this material accounts for approximately 50 percent of the growth cost, the savings is approximately 25 percent of the total growth cost to produce a 1.98 eV AlGaInP top subcell 300 over a similar top subcell 200.

Figure 6:
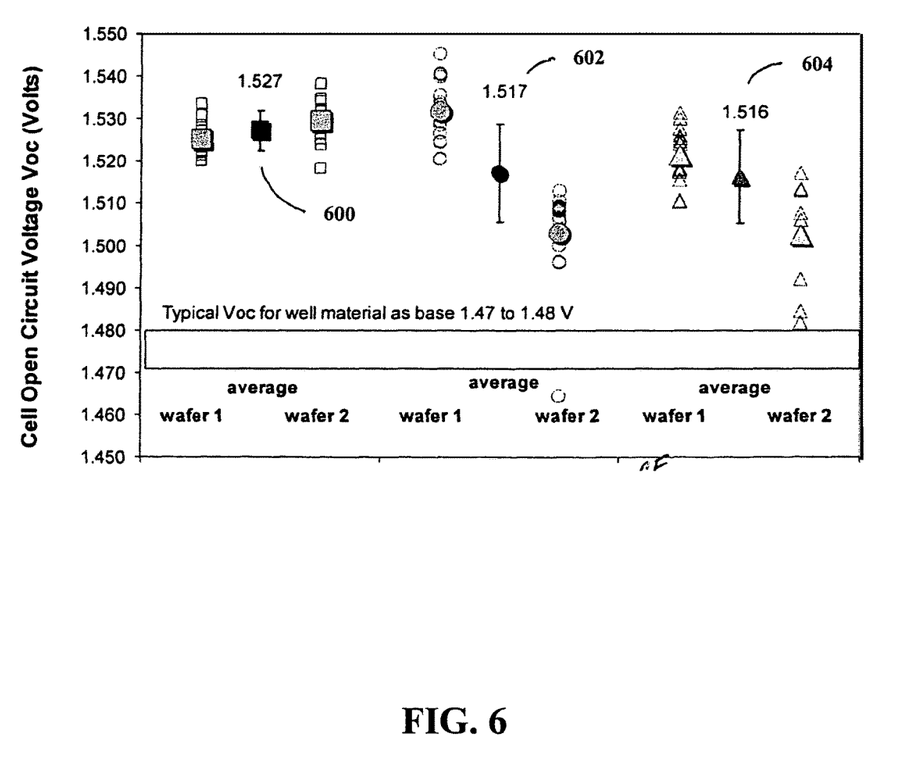
FIGS. 6 and 7 illustrate comparisons between a standard cell, a MQW cell, and a DH cell of the present invention.
Figure 7:
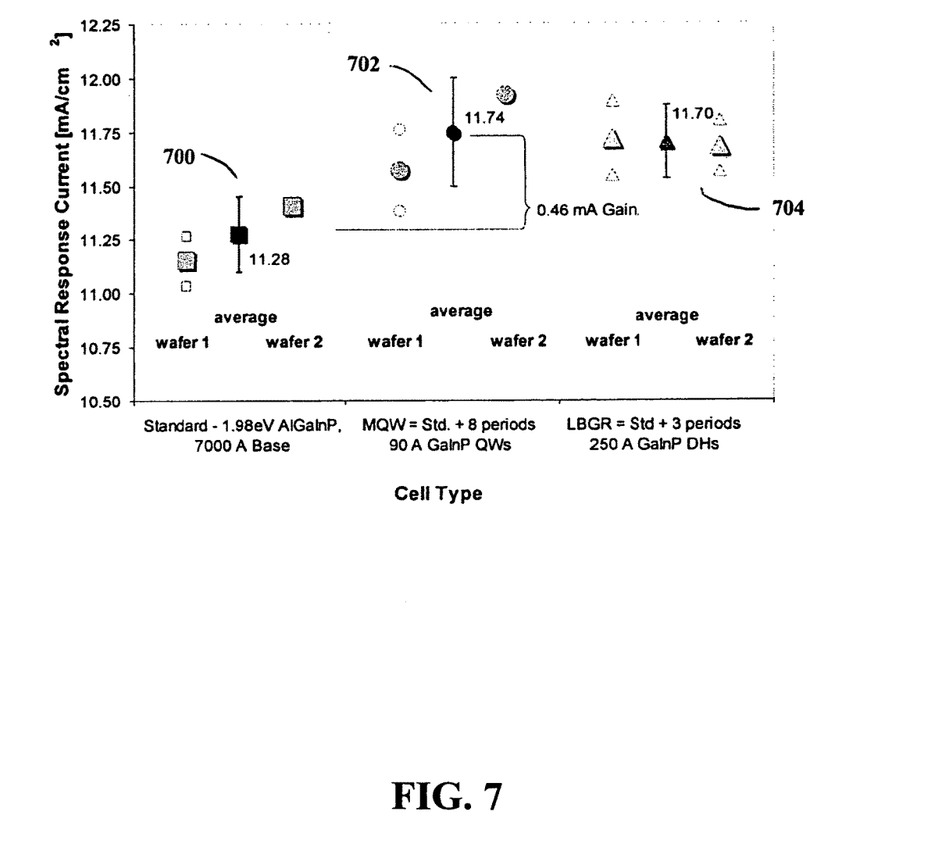

FIGS. 6 and 7 illustrate comparisons between a standard cell, a MQW cell, and a DH cell of the present invention.

FIG. 6 shows the open circuit voltage for a standard cell 600, for an MQW cell 602, and a DH cell 604. The average of 1.527 Volts for a standard cell 600, 1.517 Volts for an MQW cell 602, and 1.516 Volts for a DH cell 604 of the present invention, along with the error bars, show that there is no degradation in open circuit voltage for the DH approach.

FIG. 7 shows the spectral response current for a standard cell 700, for an MQW cell 702, and a DH cell 704. The MQW cell 704 has an increase of 0.46 mA average over the standard cell 700, and the DH cell 704 has a 0.42 mA average gain over the standard cell 700.

Flowchart

Figure 8:
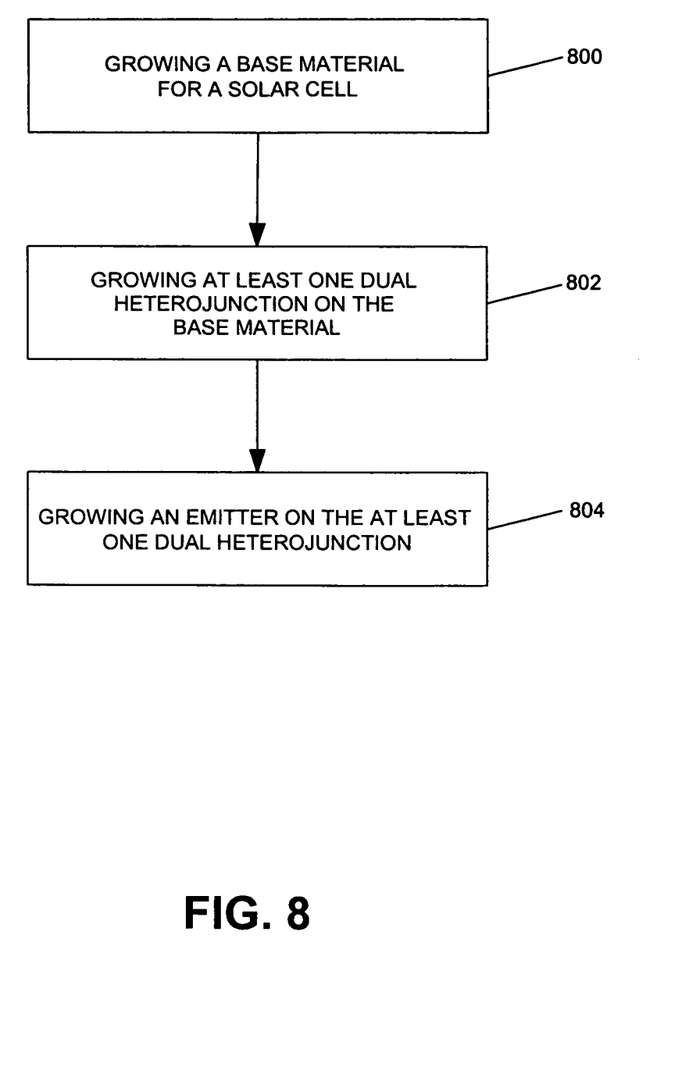
FIG. 8 is a flowchart illustrating the steps of the present invention.

FIG. 8 is a flowchart illustrating the steps of the present invention.

Box 800 illustrates growing a base material for a solar cell.

Box 802 illustrates growing at least one dual heterojunction on the base material.

Box 804 illustrates growing an emitter on the at least one dual heterojunction.

CONCLUSION

In summary, embodiments of the invention provide methods and apparatuses for a dual heterojunction multijunction solar cell. A method in accordance with the present invention comprises growing a base material for a solar cell, growing at least one dual heterojunction on the base material, and growing an emitter on the at least one dual heterojunction.

Such a method further optionally includes the base, emitter, and at least one dual hetero junction being in a top cell of a triple junction solar cell, the at least one dual heterojunction being at least 200 angstroms in thickness, the at least one dual heterojunction being a stack of alternating low bandgap materials and barrier materials, the at least one dual heterojunction being contained within a depletion region created by the base material and the emitter, and a material for the low bandgap material being one or any alloy combination (continuous or digital) of: GaAs, GaInAs, GaInAsN, GaInAsNSb, GaInP, GaPN, GaInPN, InPN, InN, InNAs, GaInPAsN, InP, AlGaInP, GaAsP, AlGaAs, GaInAsP, GaSb, InSb, InAs, Ge, SiGe, SiGeC, SiGeSn, ZnGeAs, ZnGeSiAs, CuAlGaInS, CuAlGaInSe, as long as the alloy is of lower band gap than the host surrounding barrier layers and/or base/emitter material(s).

An apparatus in accordance with the present invention comprises a substrate, and a first subcell, coupled to the substrate, wherein the first subcell comprises a base region, coupled to the substrate, an emitter region, and at least one dual heterojunction, coupled between the base region and the emitter region, wherein the at least one dual heterojunction has a lower bandgap than the emitter region.

Such an apparatus further optionally includes a second subcell, coupled between the substrate and the first subcell, the at least one dual heterojunction being at least 200 angstroms in thickness, the at least one dual heterojunction being a stack of alternating low bandgap material and barrier materials, the at least one dual heterojunction being contained within a depletion region created by the emitter region and the base region, and a material for the dual hetero junction being gallium arsenide.

An alternate embodiment of the present invention comprises a dual heterojunction region of at least 200 angstroms thickness, the dual heterojunction region being contained within a depletion region of the solar cell, such that the dual heterojunction region generates additional current in the solar cell by absorbing incident light within the dual heterojunction region.

Such an embodiment optionally further includes the dual heterojunction region being in a top subcell of a multijunction solar cell.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and the equivalents thereof.

What is claimed is:

1. A method for creating a dual heterojunction multijunction solar cell, comprising:
   growing a base material for a subcell of the multijunction solar cell;
   growing a plurality of dual heterojunctions on the base material; and
   growing an emitter on the plurality of dual heterojunctions,
   wherein each of the plurality of dual heterojunctions is other than the base material and the emitter,
   wherein each of the plurality of dual heterojunctions comprises a low bandgap material layer and a barrier material layer, such that each of the low bandgap material layers in the plurality of dual heterojunctions comprises a well layer, but there is no quantum confinement of a generated electron in the plurality of dual heterojunctions, because each of the plurality of dual heterojunctions is sufficiently thick so as not to be a quantum well and is relatively shallow so that generated carriers escape,
   wherein each of the plurality of dual heterojunctions is configured to produce a current balanced to other subcells in the multijunction solar cell connected in series to the subcell, and
   wherein each of the plurality of dual heterojunctions absorbs light below a bandgap of the base material and produces the current by generating the carriers that are collected at the base material and the emitter.

2. The method of claim 1, wherein the base material, emitter, and at least one dual heterojunction are in a top subcell of a triple junction solar cell.

3. The method of claim 2, wherein the low bandgap material layer combined with the barrier material layer is greater than 200 angstroms in thickness.

4. The method of claim 3, wherein the plurality of dual heterojunctions is a stack of alternating low bandgap material layers and barrier material layers.

5. The method of claim 4, wherein at least one of the plurality of dual heterojunctions is contained within a depletion region created by the base material and the emitter.

6. The method of claim 5, wherein the low bandgap material layer is one or any alloy combination of: GaAs, GaInAs, GaInAsN, GaInAsNSb, GaInP, GaPN, GaInPN, InPN, InN, InNAs, GaInPAsN, InP, AlGaInP, GaAsP, AlGaAs, GaInAsP, GaSb, InSb, InAs, Ge, SiGe, SiGeC, SiGeSn, ZnGeAs, ZnGeSiAs, CuAlGaInS, CuAlGaInSe, as long as the low bandgap material layer is of lower band gap than surrounding barrier material layers, base material or emitter.

7. A dual heterojunction multijunction solar cell, comprising:
   a substrate; and
   a first subcell, coupled to the substrate, wherein the first subcell comprises a base region, coupled to the substrate, an emitter region, and a plurality of dual heterojunctions,
   the plurality of dual heterojunctions being other than the base region and the emitter region and coupled between the base region and the emitter region,
   wherein each of the plurality of dual heterojunctions have a lower bandgap than the emitter region,
   wherein each of the plurality of dual heterojunctions comprises a low bandgap material layer and a barrier material layer, such that each of the low bandgap material layers in the plurality of dual heterojunctions is a well layer, but there is no quantum confinement of a generated electron in the plurality of dual heterojunctions, because each of the plurality of dual heterojunctions is sufficiently thick so as not to be a quantum well and is relatively shallow so that generated carriers escape,
   wherein each of the plurality of dual heterojunctions is configured to produce a current balanced to other subcells in the multijunction solar cell connected in series to the first subcell; and
   wherein each of the plurality of dual heterojunctions absorbs light below a bandgap of the base material and produces the current by generating the carriers that are collected at the base material and the emitter.

8. The dual heterojunction multijunction solar cell of claim 7, further comprising a second subcell, coupled between the substrate and the first subcell.

9. The dual heterojunction multijunction solar cell of claim 8, wherein the low bandgap material layer combined with the barrier material layer is greater than 200 angstroms in thickness.

10. The dual heterojunction multijunction solar cell of claim 9, wherein the plurality of dual heterojunctions is a stack of alternating low bandgap material layers and barrier material layers.

11. The dual heterojunction multijunction solar cell of claim 10, wherein the plurality of dual heterojunctions is contained within a depletion region created by the emitter region and the base region.

12. The dual heterojunction multijunction solar cell of claim 11, wherein a material for the plurality of dual heterojunctions is gallium arsenide.

13. A solar cell, comprising a subcell having a base region, an emitter region, and a plurality of dual heterojunction regions, the plurality of dual heterojunction regions being other than the base region and the emitter region and contained within a depletion region of the subcell, such that the plurality of dual heterojunction regions generates additional current in the subcell by absorbing incident light within the dual heterojunction region, each of the plurality of dual heterojunction regions comprises a low bandgap material layer that is a well layer, but there is no quantum confinement of a generated electron in the plurality of dual heterojunction regions, because each of the plurality of dual heterojunction regions is sufficiently thick so as not to be a quantum well and is relatively shallow so that generated carriers escape, each of the plurality of dual heterojunctions is configured to produce a current balanced to other subcells in the solar cell connected in series to the subcell, and each of the plurality of dual heterojunctions absorbs light below a bandgap of the base region and produces the current by generating the carriers that are collected at the base region and the emitter region.

14. The solar cell of claim 13, wherein the plurality of dual heterojunction regions is in a top subcell of a multi-junction solar cell.

* * * * *